US006553555B1

United States Patent
Green et al.

(10) Patent No.: US 6,553,555 B1
(45) Date of Patent: Apr. 22, 2003

(54) MAINTAINING SIGNAL GUARD BANDS WHEN ROUTING THROUGH A FIELD OF OBSTACLES

(75) Inventors: D. Scott Green, Taylor, TX (US); Steven J. Lash, Leander, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 09/384,172

(22) Filed: Aug. 27, 1999

(51) Int. Cl.[7] .............................. G06F 17/50; H05K 7/02
(52) U.S. Cl. ........................... 716/15; 716/12; 361/737; 361/760
(58) Field of Search .............................. 716/12, 15, 14, 716/13; 361/760, 764, 737, 761, 772, 777; 710/301

(56) References Cited

U.S. PATENT DOCUMENTS

| | | | | |
|---|---|---|---|---|
| 5,288,949 A | * | 2/1994 | Crafts | 174/250 |
| 5,519,585 A | | 5/1996 | Jones et al. | 361/818 |
| 5,923,540 A | * | 7/1999 | Asada et al. | 361/764 |
| 6,040,524 A | * | 3/2000 | Kobayashi et al. | 174/36 |
| 6,144,576 A | * | 11/2000 | Leddige et al. | 365/63 |
| 6,202,110 B1 | * | 3/2001 | Coteus et al. | 710/102 |
| 6,246,112 B1 | * | 6/2001 | Ball et al. | 257/690 |

* cited by examiner

*Primary Examiner*—Matthew Smith
*Assistant Examiner*—Lex H. Malsawma
(74) *Attorney, Agent, or Firm*—Baker Botts L.L.P.

(57) ABSTRACT

An apparatus and method for integrating high-speed DRAM in a computer system including guard bands on either side of each data signal path between a memory module and a memory controller on a circuit board. The data signal paths are routed to avoid intermediate contacts, such as perforations in the circuit board for connector pins, while maintaining a target impedance level within a specified tolerance. A connector between the memory module and the memory controller includes contacts that are arranged so that at least every other contact is assigned to a non-data signal. The routing located between the non-data signal pins are assigned to a data signal. Non-data signal paths on the circuit board are routed through the contacts on either side of each data signal path, thereby forming guard bands on either side of the data signal path. An air gap is also positioned on either side of the data signal path.

38 Claims, 4 Drawing Sheets

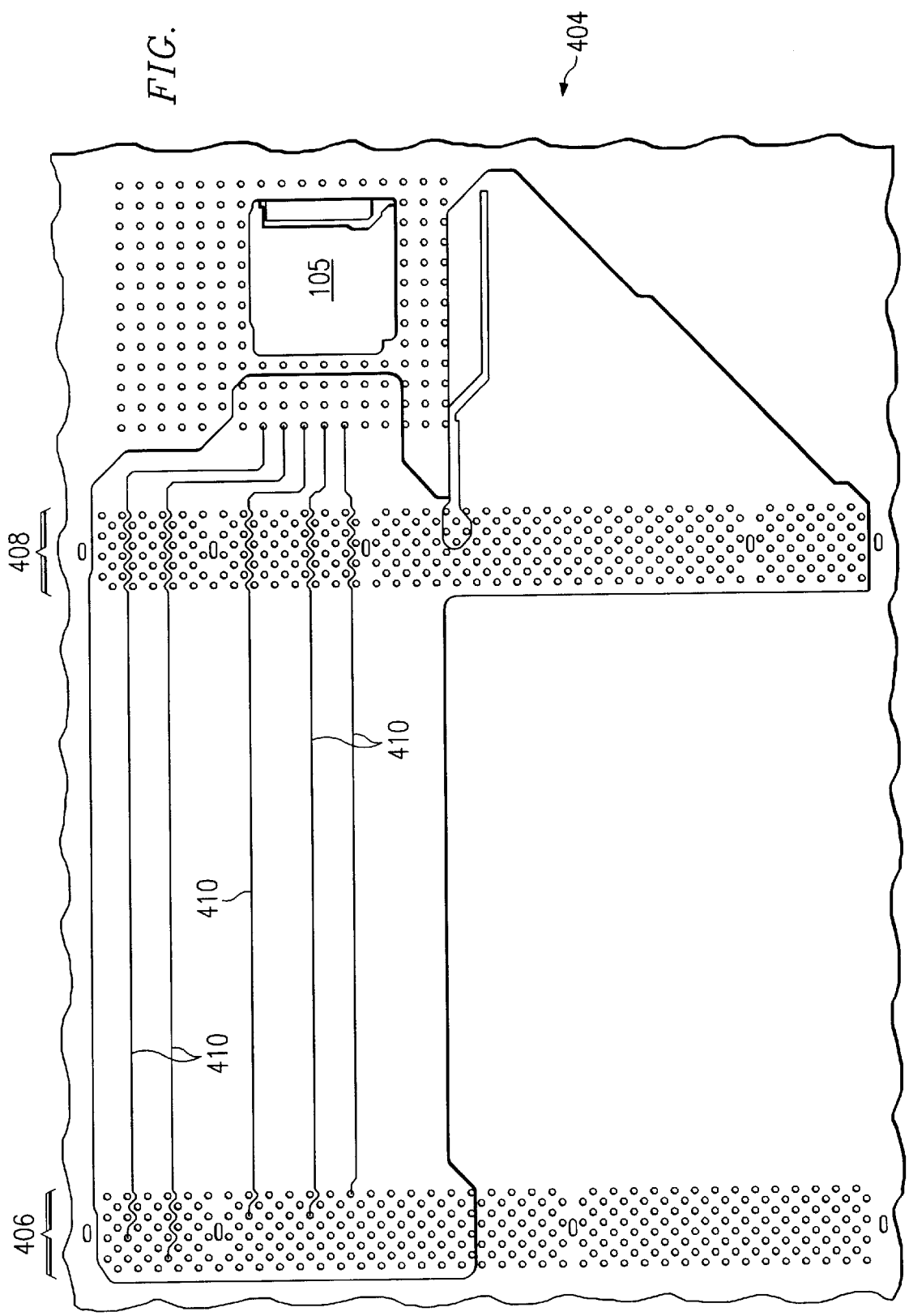

MAINTAINING SIGNAL GUARD BANDS WHEN ROUTING THROUGH A FIELD OF OBSTACLES

BACKGROUND OF THE INVENTION

1. Field of the Invention

This invention relates to computer memory systems, and more particularly, to a method and apparatus for routing signal paths on a printed circuit board for high speed DRAM requiring low signal path impedance.

2. Description of the Related Art

Competitive pressure and customer demand in the computer industry is currently forcing computer manufacturers to lower cost, reduce size, and increase performance of their products. Currently, all Pentium and higher-grade buses operate in the range of at least 66 MHz up to 300 MHz. As operating systems and application programs have grown, so has the need for more memory that operates at faster speed. Dynamic random-access memory (DRAM) manufacturers have continued to improve the cost, speed, and density of their chips using various configurations such as fast page mode (FPM) DRAM chips capable of reaching a maximum frequency of 28.5 MHz within a given page of memory, extended-data-out (EDO) DRAM which achieves a maximum frequency of 40 MHz, and synchronous DRAM (SDRAM) and burst EDO (BEDO) DRAM capable of burst rates up to 100 MHz. Higher speed buses capable of data transfer rates in the gigahertz range are planned to be introduced in the near future. Ideally, the memory must supply data to the processor at the same speed as the processor's system clock. Thus, there is a need to further improve DRAM speed over current capabilities.

Two new memory designs, SyncLink and Rambus, address current and near-future memory speed and bandwidth needs. SyncLink is a consortium of DRAM manufacturers which have proposed a draft standard to the IEEE for a uniform memory architecture that will evolve over several iterations. The SyncLink standard is royalty-free and open to all. The proposal calls for a command-driven, packet-oriented bus operating up to 800 MHz, with a 16-bit wide data path. Rambus is a high-speed DRAM subsystem, known as Direct Rambus, that is currently capable of transferring data at speeds of 1.6 gigabytes per second. Direct Rambus memory modules, known as RIMM modules, use standard industry assemblies similar to those of dual in-line memory modules (DIMMs). The subsystem consists of the RAM, the RAM controller, and the bus (channel) connecting the RAM to the microprocessor and devices in the computer that use it.

It is likely that additional high-speed memory modules will be developed in the future. High-speed RAM is expected to accelerate the growth of visually intensive interfaces such as 3-D, interactive games, and streaming multimedia. Much faster data transfer rates from attached devices such as videocams using firewire and the accelerated graphics port (AGP) make it important to reduce the bottleneck in getting data into the computer, staging it in RAM, and moving it through the microprocessor and to the display or other output devices. Traditionally, digital system designers could develop systems without much regard to board layout issues such as trace length, width, impedance, capacitive loading, and routing. But as digital systems are pushed to higher frequencies, these issues become increasingly critical. Thus, it is necessary to provide a printed circuit board (PCB) layout that is capable of meeting the performances requirements of high-speed memory modules as they are developed and integrated in state-of-the-art computer systems.

SUMMARY OF THE INVENTION

In accordance with one embodiment of the present invention, there is provided an apparatus for coupling a memory controller and a memory module in electrical communication. A plurality of data signal paths are formed on a circuit board. Each data signal path being operable to conduct an electrical data signal between the memory controller and the memory module. A plurality of non-data signal paths are also formed on the circuit board. The pinout of a connector for coupling the memory controller and the memory module is designed so that at least one of the non-data signal is positioned beside each data signal. As a result, non-data signal paths are positioned beside each data signal path, thereby forming guard bands on both sides of the data signal paths.

The circuit board includes a plurality of contacts that are operable to conduct electric signals and are typically used to plug in connectors for devices such as memory modules. In the present invention, the data signal paths are routed between the contacts on the circuit board so as to avoid the contacts. Each non-data signal path is routed through the contacts on one side of a corresponding data signal path. Each non-data signal path conducts the same electrical signal as the contacts through which it is routed.

The guard bands formed on both sides of the data signal paths help insure the impedance level, current return path, and shielding required by the data signal path, even on a densely perforated circuit board such as a motherboard. To further maintain circuit impedance within desired tolerances, the width of the data signal paths is substantially constant along the length of the data signal path, and the non-data signal paths are substantially parallel to the data signal paths.

In another embodiment, the memory module includes at least one memory chip mounted on a connector card. A connector is used to mate the connector card with the circuit board. The connector includes a plurality of paths corresponding to the data signal paths and the non-data signal paths, so that signals may be transmitted between the memory controller and the memory chip. The non-data signal paths are either ground signal paths, power signal paths, or a combination of ground and power signal paths, depending on the memory controller's signal requirements.

In another embodiment, the memory module includes at least one memory chip mounted on a connector card. A connector is used to mate the connector card with a memory expansion card (MEC). The MEC plugs into the circuit board. The connector, the connector card, and the MEC include a plurality of paths corresponding to the data signal paths and the non-data signal paths, so that signals may be transmitted between the memory controller and the memory chip. The non-data signal paths are either ground signal paths, power signal paths, or a combination of ground and power signal paths, depending on the memory controller's signal requirements.

The present invention is particularly suitable for use with high-speed DRAM modules, such as the Rambus DRAM module, where strict impedance tolerances are imposed along the data signal paths. The present invention is also suitable in any application where guard banding is used to help control the impedance level, current return path, and shielding required by the data signal path, even when signal paths are routed through densely populated environments.

The foregoing has outlined rather broadly the objects, features, and technical advantages of the present invention so that the detailed description of the invention that follows may be better understood.

BRIEF DESCRIPTION OF THE DRAWINGS

The present invention may be better understood, and its numerous objects, features, and advantages made apparent to those skilled in the art by referencing the accompanying drawings.

FIG. 4B is a top view of a portion of a motherboard diagram showing signal paths from memory modules to a memory controller according to the present invention.

The use of the same reference symbols in different drawings indicates similar or identical items.

DETAILED DESCRIPTION

Figure 1:
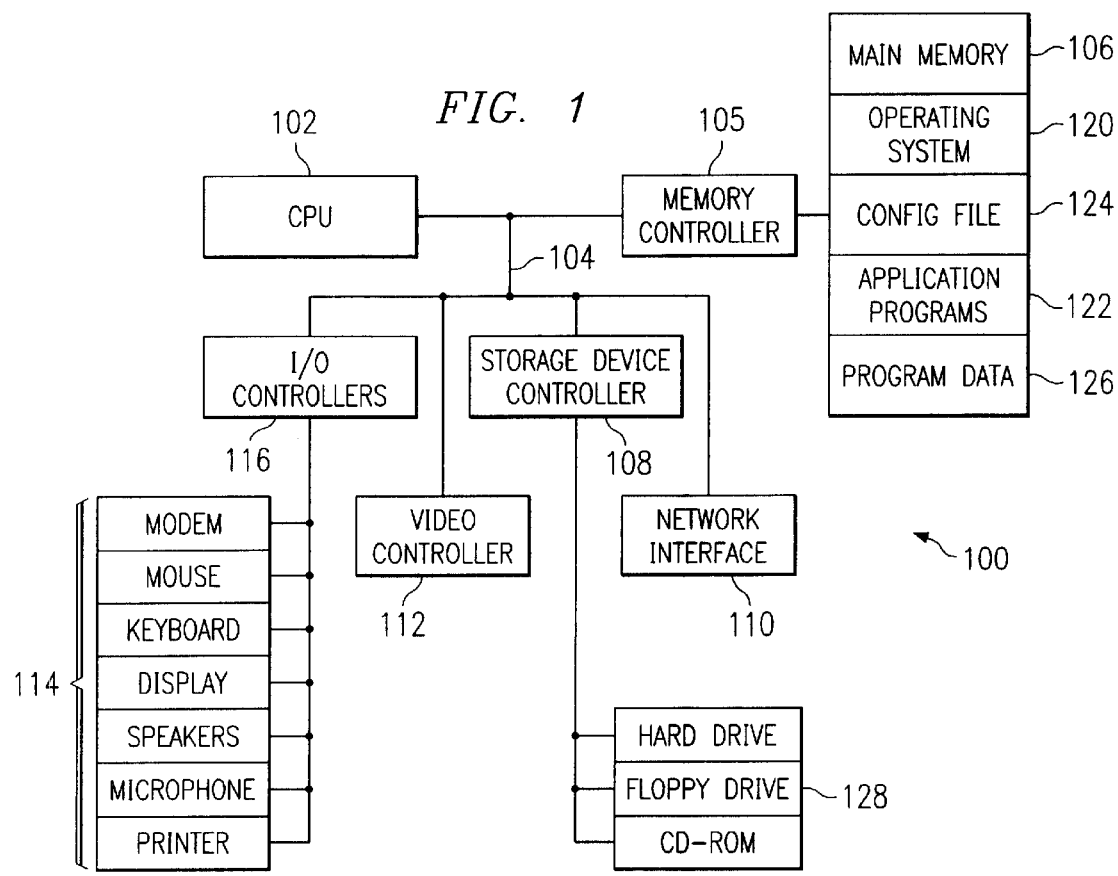
FIG. 1 is a block diagram of a typical computer system with which the present invention may be utilized.

Referring to FIG. 1, computer system 100 includes a central processing unit (CPU) 102 connected by system bus 104 to various components including main controller 105, main memory 106, storage device controller 108, network interface 110, video controller 112, and input/output devices 114 connected via input/output (I/O) controllers 116. Those skilled in the art will appreciate that this system encompasses all types of computer systems: personal computers, midrange computers, mainframes, etc. Note that many additions, modifications, and deletions can be made to this computer system 100 when used as a component of the present invention. Examples of I/O devices that may be connected to system bus 104 for entering and receiving data include a modem, mouse, keyboard, display monitor, speakers, microphone, and printer. Computer system 100 may be one of many workstations connected to a network such as a local area network (LAN), a wide area network (WAN), or a global information network such as the Internet through network interface 110.

CPU 102 can be constructed from one or more microprocessors and/or integrated circuits. Main memory 106 stores programs and data that CPU 102 may access. When computer system 100 starts up, operating system 120 is loaded into main memory 106. Operating system 120 is a program that manages the resources of computer system 100, such as CPU 102, memory controller 105, storage device controller 108, network interface 110, I/O controllers 116, and system bus 104. The operating system 120 reads one or more configuration files 124 to determine the hardware and software resources connected to computer system 100.

During operation, main memory 106 includes operating system 140, configuration file 124, and one or more application programs 122 with related program data 126. Application programs 122 can run with program data as input, and output their results as program data 126 in main memory 106 or to one or more mass storage devices 128 through memory controller 105 and storage device controller 108. CPU 102 executes many application programs 122, including one or more programs to establish a connection to a computer network through network interface 110. The application program 122 may be embodied in one executable module or it may be a collection of routines that are executed as required.

Storage device controller 108 allows computer system 100 to retrieve and store data from mass storage devices 128 such as magnetic media (hard disks, diskettes) and optical disks (CD-ROM). The mass storage devices 128 are commonly known as Direct Access Storage Devices (DASD), and act as a permanent store of information. The information from the DASD can be in many forms including application programs and program data. Data retrieved through storage device controller 108 is usually placed in main memory 106 where CPU 102 can process it.

System bus 104 allows data to be transferred among the various components of computer system 100. Although computer system 100 is shown to contain only a single main CPU 102 and a single system bus 104, those skilled in the art will appreciate that the present invention may be practiced using a computer system that has multiple CPUs 102 and/or multiple busses 104. In addition, the interfaces that are used in the preferred embodiment may include separate, fully programmed microprocessors that are used to off-load computationally intensive processing from CPU 102, or may include input/output (I/O) adapters to perform similar functions.

Figure 2:
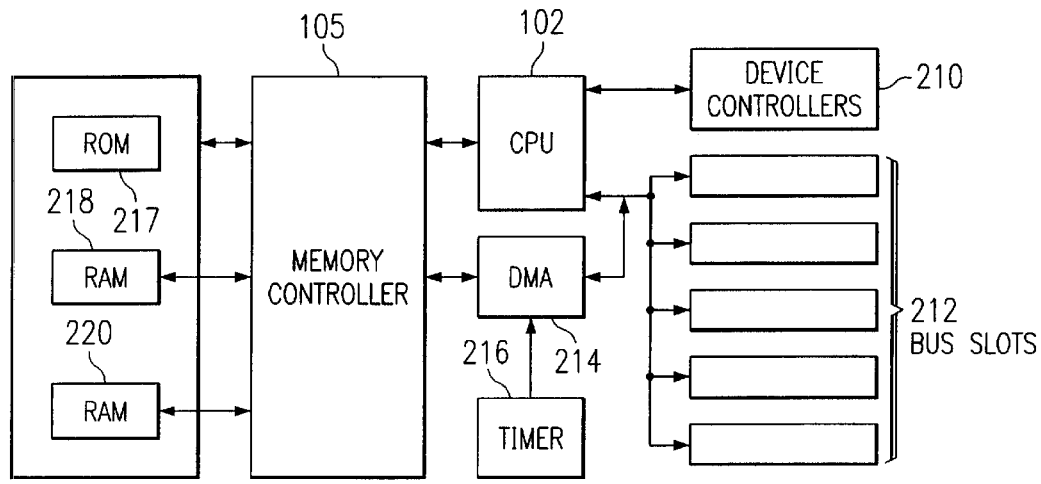
FIG. 2 is a diagram of components on a motherboard of an exemplary computer system.

FIG. 2 shows components of computer system 100 which are typically mounted on a main printed circuit board, often referred to as the system's motherboard, including CPU 102, memory controller 105, main memory 106, device controllers 210, expansion bus slots 212, direct memory access (DMA) controller 214, and a clock or timer 216. Main memory 106 includes a combination of read only memory (ROM) 217 and random access memory (RAM) 218, 220. There are several different types of both ROM 217 and RAM 218, 220 known in the art including various types of high-speed dynamic RAM (DRAM). Each type of DRAM has its own internal features and performance characteristics. Memory controller 105 includes logic and data processing capabilities for controlling the flow of data between main memory 106, DMA controller 214 and CPU 102. DMA controller 214 includes logic and data processing capabilities for controlling the flow of data directly between main memory 106 and one or more devices. DMA controller 214 eliminates routing through CPU 102, providing faster access to data by devices in bus slots 212.

Figure 3:
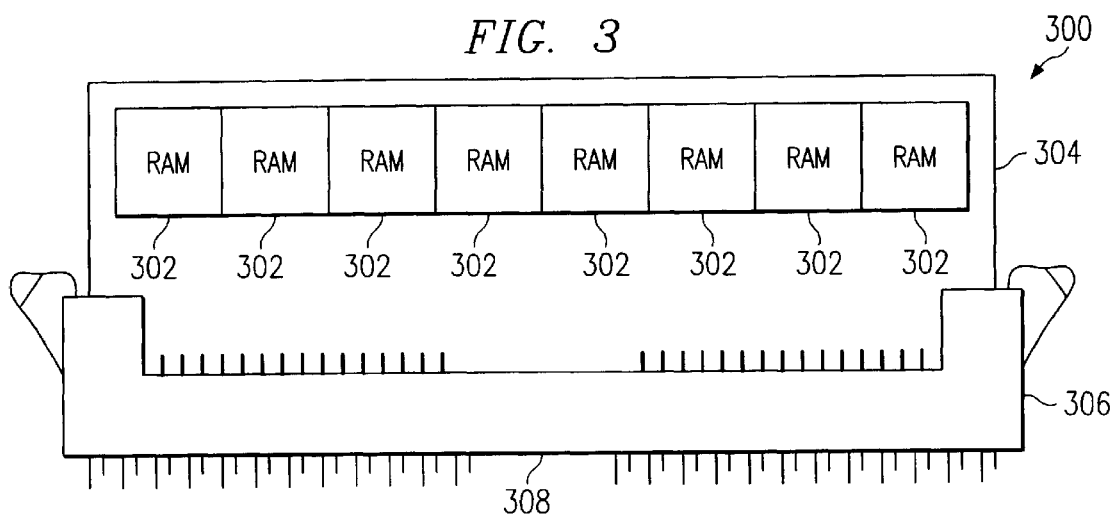
FIG. 3 is a front view of a diagram of a high speed memory module mounted in a connector card.
Figure 4A:
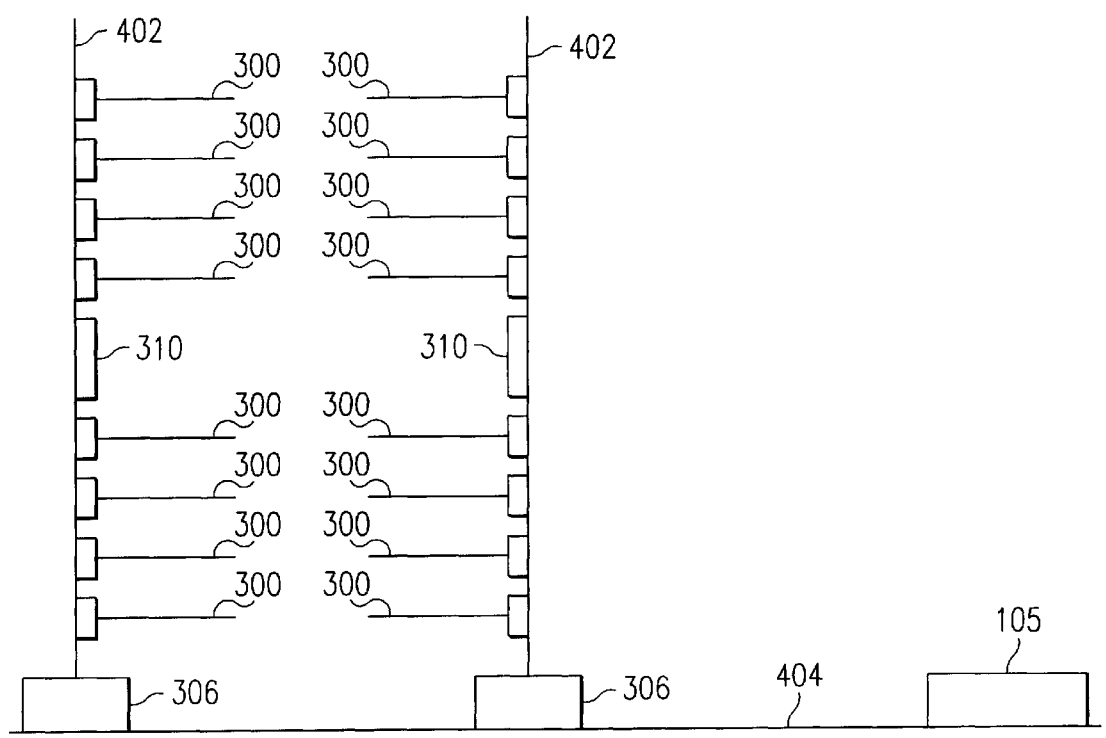
FIG. 4A is a front view of a diagram of high speed memory modules mounted on a MEC, with the MEC mounted on a motherboard.

Multichip modules (MCMs) such as inline memory modules 300 as shown in FIG. 3, are a common way of combining multiple memory chips 302 on connector board 304 and offer the advantage of being able to expand a computer system's memory capacity using one or more add-in modules. In one embodiment, inline memory module 300 plugs directly into perforations in a motherboard. In an alternative embodiment, inline memory module 300 plugs into a connector 306 that mates with memory expansion card (MEC) 402 as shown in FIG. 4a. MEC 402 then plugs into a connector on motherboard 404.

The MCM package dimensions are fairly standardized across the computer industry for nonvolatile memories, however, the pinout (i.e., what signals are on what pins 308) can vary from manufacturer to manufacturer depending on the specific needs of the system. Thus, not every MCM will function in every connector across computer systems.

Pins 308 carry a variety of signal types including for example, data inputs/outputs, power supply, ground, address inputs, row and column address strobes, read and write enable, and presence detect. Signal paths (also commonly known as traces) are laid on connector board 304, through connector 306, and on the motherboard to connect signals from memory chips 302 to memory controller 105. In one embodiment, chip set 310 handles the data flow between a corresponding proportion of memory chips 302 through connector 306. For example, in FIG. 3, each chip set 310 routes signals for the eight memory chips 302.

Since DRAMs place a capacitive load on a signal path, they significantly affect the impedance over at least a portion of the signal paths. A goal in designing circuit boards capable of supporting high-speed DRAM is to maintain impedance within a specified tolerance over a substantial portion of the length of the signal path. In the prior art, it is known to trade off design parameters such as dielectric thickness between the signal and ground layers of a circuit board, signal path width, memory module spacing, and target channel impedance, against one another to meet the specific needs of the design. For example, to increase impedance, the dielectric thickness or memory module spacing is increased. Alternatively, if signal path widths are decreased, impedance will increase. This approach may be adequate in an uncluttered circuit board environment, however, it is often difficult to vary these parameters to achieve multiple signal paths with approximately constant impedance when a circuit board, such as a motherboard, is densely populated with a numerous perforations and a wide variety of components.

Another method of maintaining approximately constant impedance along a signal path is known in the art as guard banding which requires the signal path to be routed between two signal traces that run parallel to the signal path. The guard band signal traces do not carry data signals. When the signal path needs to be routed between obstacles on a crowded circuit board, such as a motherboard, there is often not enough room to maintain the desired width of the guard banding. In very high density areas, the guard banding may be lost completely, thereby causing impedance mismatch and degraded signal quality due to reflection. Further, when utilizing high-speed memory devices, it is desirable to use the shortest route possible between two points to keep signal propagation time to a minimum. Therefore, it is typically not practical to route the signal paths and their guard bands very far out of the way to go around such obstacles.

The present invention provides a method and apparatus for maintaining impedance along a signal path within a desired tolerance using guard banding between signal paths from memory controller 105 to connector 306. One example of a situation where the present invention may be utilized is shown in FIG. 4a where a plurality of memory modules 300 are connected to MECs 402, and MECs 402 are connected to motherboard 404. FIG. 4b shows a top view of motherboard 404 having rows of perforations 406 and 408 for receiving pins 308 of connectors 306. Note that in order for signal paths, as exemplified by signal path 410, to be routed from memory controller 105 to rows of perforations 406, signal path 410 must be routed through rows of perforations 408.

The impedance that may be achieved with a given board layout configuration is determined by the following factors: the dielectric thickness between the signal and ground layers of motherboard 404, the width of signal path 410, the minimum air gap required between signal paths and guard bands, the width of the guard bands, and the distance between connector pins 308.

Figure 4C:
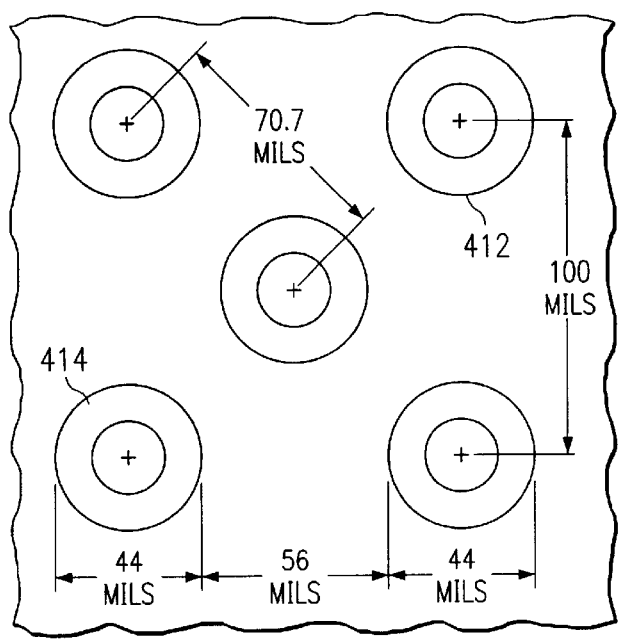
FIG. 4C is an enlarged top view of perforations in a motherboard.

There are 100 mils (one mil being approximately equal to 0.001 inch) between the centers of adjacent perforations 412 for standard connectors found in the prior art as shown (not to scale) in FIG. 4c. The diameter of connector pad 414 (i.e., the layer(s) of lining in perforation 412 for receiving connector pins 308) is 44 mils, leaving 26 mils between diagonally adjacent perforations. The minimum signal path 410 width is 16 mils, the minimum width of two air gaps (not shown) required between signal path 410 and the guard bands (not shown) is a total of ten (10) mils, and the minimum width of two guard bands (not shown) is a total of 20 mils. Thus, the total distance required between perforations is 46 mils, however only 26 mils are available between diagonally adjacent perforations. Since there is already a deficit of twenty (20) mils, there is no room left for each of two guard bands on either side of signal path 410. Thus, the target impedance level for signal path 410 associated with high-speed memory devices such as Rambus DRAM cannot be met.

One alternative is to use guard bands that are four (4) mils wide and decrease the impedance by decreasing the thickness of the dielectric layers in motherboard 404. A drawback to this alternative, however, is that the impedance of the motherboard will not meet the 60 ohms impedance required by other components on motherboard 404.

Figure 4D:
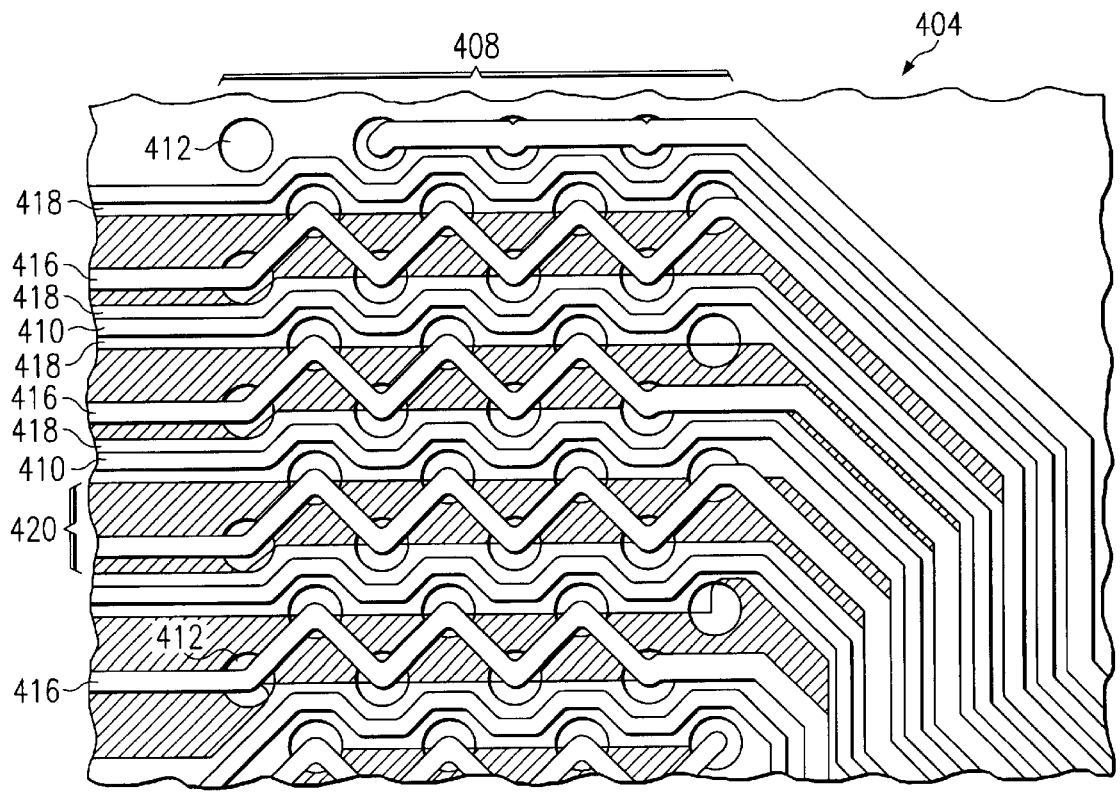
FIG. 4D is an enlarged top view of a portion of a motherboard diagram of guard bands between signal paths according to the present invention.

The present invention advantageously allows enough space for guard bands having the desired width, thereby eliminating the need to vary the dielectric thicknesses in motherboard 404 or to re-locate components on motherboard 404. To accomplish this, the signals on connector pins 308 are strategically assigned so that a non-data signal, such as a ground signal or a power signal, lies on either side of a data signal path 410 as shown in FIG. 4d. The paths for the non-data signals are also referred to as guard bands 416 and are shown in FIG. 4d as a relatively wide signal paths that zig-zag between perforations 412. Thus, all connector pins 308 on one side of signal path 410 must be of the same type, (i.e., power or ground), and all connector pins on the other side of signal path 410 must be of the same type (i.e., power or ground).

FIG. 4d shows an enlarged portion of motherboard 404 including signal path 410 as it passes through rows of perforations 408. Guard bands 416 are positioned on either side of signal path 410 in a manner that achieves the desired level of impedance. High-speed memory devices typically dictate a target impedance and corresponding tolerance values above and below the target impedance. For example, Rambus memory devices specify target impedance of 28 ohms with a tolerance of plus and minus 10 percent. Utilizing the present invention, a computer system manufacturer may then design a pin-out configuration for connector 306 that allows guard bands 416 to be placed on both sides of the data signals to provide the target impedance within tolerances.

In the embodiment of the present invention shown in FIGS. 4b and 4d, one example of a target impedance is 28 ohms plus or minus ten percent, resulting in a required width of signal path 410 of 16 mils. In this example, the minimum required width of air gaps 418 is five (5) mils, and the required width of guard bands 416 is 10 mils. Thus, a total space of 66 mils between signal paths 410 is required.

Accordingly, in an embodiment of the present invention using a standard connector with 100 mils between pin centers (70.7 mils diagonally) as discussed above, the pinout for connector 306 in the present invention is arranged such that guard bands 416 connect two rows of perforations 412, allowing the room required for air gaps 418 and signal path 410 as they are routed around perforations 412. Note that in order to maintain air gaps 418 having a substantially uniform width, fillet 420 (shown in FIG. 4d as a series of thin lines) is applied to guard bands 416. Signal path 410 is also shown as being routed around perforations 412 to avoid contact with adjacent guard bands 416.

While the invention has been described with respect to the embodiments and variations set forth above, these embodiments and variations are illustrative and the invention is not to be considered limited in scope to these embodiments and variations. For example, various types of connectors may be utilized to connect memory modules to a circuit board such as a motherboard. The embodiments discussed included connectors having contacts formed by pins that plug into corresponding contacts, known as sockets (perforations) in the circuit board. The present invention may be utilized with all types of connectors that allow signals to be routed around the contact portions on the circuit board that correspond to contact portions on the connector. Accordingly, various other embodiments and modifications and improvements not described herein may be within the spirit and scope of the present invention, as defined by the following claims.

What is claimed is:

1. An apparatus for maintaining guard banding around a data signal, the apparatus comprising:
    a circuit board having a plurality of contacts including a group of contacts selected from the plurality of contacts, the contacts being operable to conduct electric signals;
    a data signal path on the circuit board, the data signal path being operable to conduct the data signal, the data signal path being routed through the group of contacts on the circuit board without interacting with any of the contacts; and
    at least two non-data signal paths on the circuit board, a first non-data signal path being positioned on a first side of the data signal path, a second non-data signal path being positioned on a second side of the data signal path, the at least two non-data signal paths extending at least a portion of the length of the data signal path, the first non-data signal path interacting with the contacts on the first side of the data signal path, the second non-data signal path interacting with the contacts on the second side of the data signal path, each non-data signal path conducting the same electrical signal as the contacts the signal interacts therewith.

2. The apparatus, as set forth in claim 1, wherein the contacts include perforations in the circuit board, the data signal path being routed between a plurality of the perforations in the circuit board without interacting with the perforations, the perforations operable to receive pins for conducting a non-data signal to each non-data signal path, the data signal path being routed to maintain substantially constant spacing between the data signal path and the at least two non-data signal paths.

3. The apparatus, as set forth in claim 2, further comprising:
    a memory module;
    a memory controller;
    a connector having a plurality of contacts for conducting electrical signals, at least one contact on the connector being assigned to conduct the data signal, at least two contacts on the connector being assigned to conduct the non-data signal, wherein the at least one contact assigned to conduct the data signal is placed between the at least two contacts assigned to conduct the non-data signals, the memory module being in electrical communication with the connector;
    wherein the contacts on the circuit board correspond to the contacts on the connector to enable electrical communication between the memory module and the memory controller when the connector is operatively connected to the circuit board.

4. The apparatus, as set forth in claim 3, wherein each data signal path is routed between the contacts assigned to conduct a non-data signal.

5. The apparatus, as set forth in claim 4, further comprising:
    at least one memory chip;
    a connector card, wherein the at least one memory chip is mounted on the connector card to form the memory module; and
    a connector for mating the connector card with the circuit board, the connector including a plurality of paths corresponding to the data signal paths and non-data signal paths between the memory module and the circuit board.

6. The apparatus, as set forth in claim 5, wherein the memory module is a high-speed DRAM module.

7. The apparatus, as set forth in claim 5, wherein the memory module is a Rambus DRAM module.

8. The apparatus, as set forth in claim 3, further comprising:
    an air gap positioned on the first side of the data signal path; and
    another air gap positioned on the second side of the data signal path, wherein the air gaps are positioned between the data signal path and the non-data signal paths.

9. The apparatus, as set forth in claim 8, further comprising a fillet co-located with each non-data signal path, each fillet being shaped so th at the width of each air gap is substantially constant along the length of the air gap.

10. The apparatus, as set forth in claim 1, wherein the non-data sign al is a ground signal.

11. An apparatus for coupling a memory controller and a memory module in electrical communication, the apparatus comprising:
    a connector having a first plurality of contacts for conducting electrical signals, at least one of the contacts being assigned to conduct a data signal, at least two of the contacts being assigned to conduct a non-data signal, wherein the at least one contact assigned to conduct a data signal is placed between the at least two contacts assigned to conduct a non-data signal, the memory module being coupled to and in electrical communication with the connector;
    a circuit board including a data signal route, a non-data signal route and a second plurality of contacts, the second plurality of contacts operable to carry electrical signals corresponding to the first plurality of contacts, the data signal route and non-data signal route being operable to carry the electrical signals from the second plurality of contacts to the memory controller, the contacts via the signal routes establishing electrical communication between the memory module and the memory controller when the connector is operatively connected to the circuit board;

the data signal route located to avoid interaction with other contacts not associated with the connector; and the non-data signal route interacts with the contacts on the one side of the data signal route and another non-data signal route interacts with the contacts on the other side of the data signal route, each non-data signal route conducting the same electrical signal as the contacts through which it interacts therewith.

12. The apparatus, as set forth in claim 11, wherein the non-data signal routes are substantially parallel to the data signal routes.

13. The apparatus, as set forth in claim 12, wherein the non-data signal routes positioned on the one side and the another side of the data signal route conduct a ground signal.

14. The apparatus, as set forth in claim 12, wherein the non-data signal routes positioned on the one side and the another side of the data signal route conduct power signals.

15. The apparatus, as set forth in claim 12, wherein one non-data signal route positioned on the one side of the data signal route is a power signal, and the another non-data signal route positioned on the other side of the data signal route is a ground signal.

16. The apparatus, as set forth in claim 12, further comprising a plurality of air gaps, one air gap being positioned between each data signal route and non-data signal route.

17. The apparatus, as set forth in claim 12, further comprising a fillet co-located with each non-data signal route, each fillet being shaped so that the width of each air gap is substantially constant along the length of the air gap.

18. The apparatus, as set forth in claim 11, further comprising:
at least one memory chip; and
a connector card, wherein the at least one memory chip is mounted on the connector card to form the memory module, the connector card being inserted in the connector, the connector being operatively connected to the circuit board.

19. The apparatus, as set forth in claim 11, wherein the memory module is a high-speed DRAM module.

20. The apparatus, as set forth in claim 11, wherein the memory module is a Rambus DRAM module.

21. A computer system having a memory controller coupled to a memory module for electrical communication, the computer system comprising:
a motherboard having a plurality of contacts, the contacts being operable to conduct electric signals;
a plurality of data signal paths on the motherboard, each data signal path being operable to conduct a data signal between the memory controller and the memory module, the data signal paths being routed from a memory controller contact area to a memory module contact area such that the path passes through other contact areas on the motherboard while avoiding interactions with the contacts therethrough; and
a plurality of guard band signal traces on the motherboard, at least one guard band signal trace being positioned on one side of each data signal path, at least another guard band signal trace being positioned on another side of each data signal path; and
the guard band signal traces are routed to interact with the contacts on the one side of the data signal path, each guard band signal trace conducting the same electrical signal as the contacts through which it interacts therewith.

22. The computer system, as set forth in claim 21, further comprising:

at least one memory chip;
a connector card, wherein the at least one memory chip is mounted on the connector card to form the memory module; and
a connector for mating the connector card with the motherboard, the connector including a plurality of contacts corresponding to the contacts on the motherboard.

23. The computer system, as set forth in claim 21, wherein the guard band signal traces conduct a ground signal.

24. The computer system, as set forth in claim 21, wherein the guard band signal traces conduct a power signal.

25. The computer system, as set forth in claim 21, wherein at least one guard band signal trace conducts a power signal, and at least another guard band signal trace conducts a ground signal.

26. The computer system, as set forth in claim 21, wherein the memory module is a high-speed DRAM module.

27. The computer system, as set forth in claim 21, wherein the memory module is a Rambus DRAM module.

28. A method of routing a data signal through obstacles on a circuit board, the method comprising:
routing a plurality of data signal paths on a circuit board from a first device contact area to a second device contact area, the circuit board includes a plurality of contact areas for conducting electrical signals, each data signal path passing through a third contact area without interacting with the contacts therethrough;
forming a guard band around the data signal path with at least two non-data signal paths, each non-data signal path formed on one side of the data signal path and interacting with at least one contact within the third contact area as the non-data signal path routes through the third contact area; and
assigning a non-data signal type to the at least one contact within the third contact area that interacts with each non-data signal path.

29. The method of claim 28, wherein the non-data signal type is selected from a group consisting of a power signal and a ground signal.

30. The method of claim 28, wherein the guard band includes the data signal path routed between a pair of non-data signal paths, further comprising:
associating the contacts on a first side of the data path with one of the pair of non-data signal paths; and
associating the contacts on a second side of the data signal path with another of the pair of non-data signal paths.

31. The method of claim 30, wherein at least one of the pair of non-data signal paths conducts a power signal, and at least another of the pair of non-data signal paths conducts a ground signal.

32. The method of claim 28, further comprising positioning an air gap between each data signal path and non-data signal path.

33. The method of claim 32, further comprising co-locating a fillet with each non-data signal path, each fillet being shaped so that the width of each air gap is substantially constant along the length of the air gap.

34. The method of claim 28, wherein the first device is a memory module and the second device is a memory controller, further comprising:
mounting at least one memory chip on a connector card to form the memory module; and
mating the connector card with the circuit board using a connector to couple the data signal paths and the non-data signal paths between the connector card, the memory module, and the memory controller.

35. The method of claim 34, wherein the memory module comprises a high-speed DRAM module.

36. The method of claim 34, wherein the memory module comprises a Rambus DRAM module.

37. The method of claim 34, further comprising:

arranging a first plurality of connector contacts in rows, the connector contacts being conductive portions of a connector;

assigning at least one row of the first plurality of connector contacts to conduct a data signal;

assigning at least two rows of the first plurality of connector contacts to conduct a non-data signal;

positioning the at least one row of the first plurality of connector contacts assigned to conduct a data signal between the at least two rows of the plurality of connector contacts assigned to conduct the non-data signals;

forming a second plurality of contacts on the circuit board corresponding to the first plurality of contacts; and operatively connecting the connector card to the circuit board to establish electrical communication between the memory module and the memory controller.

38. The method of claim 37, further comprising:

routing each data signal path between the at least two rows of the second plurality of contacts being assigned to conduct a non-data signal.

* * * * *